United States Patent
Chen et al.

(10) Patent No.: US 10,388,697 B2
(45) Date of Patent: Aug. 20, 2019

(54) MAGNETIC RANDOM ACCESS MEMORY AND MANUFACTURE THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Zhuofan Chen, Shanghai (CN); Yibin Song, Shanghai (CN); Haiyang Zhang, Shanghai (CN)

(73) Assignees: SEMICONDUCTOR MANUFACTURING INTERNATIONAL (SHANGHAI) CORPORATION (CN); SEMICONDUCTOR MANUFACTURING INTERNATIONAL (BEIJING) CORPORATION (CN)

( * ) Notice: Subject to any disclaimer, the term of this patent is extended or adjusted under 35 U.S.C. 154(b) by 0 days.

(21) Appl. No.: 15/799,915

(22) Filed: Oct. 31, 2017

(65) Prior Publication Data
US 2018/0122855 A1    May 3, 2018

(30) Foreign Application Priority Data
Oct. 31, 2016   (CN) .......................... 2016 1 0925894

(51) Int. Cl.
| | | |
|---|---|---|
| H01L 43/02 | (2006.01) | |
| H01L 27/22 | (2006.01) | |
| H01L 21/822 | (2006.01) | |
| H01L 43/08 | (2006.01) | |
| H01L 43/12 | (2006.01) | |
| H01L 27/06 | (2006.01) | |

(52) U.S. Cl.
CPC ........ *H01L 27/222* (2013.01); *H01L 21/8221* (2013.01); *H01L 43/08* (2013.01); *H01L 43/12* (2013.01); *H01L 27/0688* (2013.01)

(58) Field of Classification Search
CPC ........ H01L 27/222; H01L 43/08; H01L 43/12
See application file for complete search history.

(56) References Cited

U.S. PATENT DOCUMENTS

| | | | |
|---|---|---|---|
| 8,625,322 B2 * | 1/2014 | Samachisa | G11C 13/0002 365/130 |
| 9,412,935 B1 | 8/2016 | Lin | |
| | (Continued) | | |

OTHER PUBLICATIONS

European Search Report corresponding to EP1719887, dated Mar. 13, 2018, 1 page.

*Primary Examiner* — Benjamin P Sandvik
(74) *Attorney, Agent, or Firm* — Innovation Counsel LLP

(57) ABSTRACT

A magnetic random access memory and its manufacturing method related to semiconductor techniques. The magnetic random access memory comprises a word line, a bit line, and a memory unit positioned between the word line and the bit line, wherein the memory unit comprises a fixture layer connecting the bit line, a free layer connecting the word line, and an insulation layer positioned between the fixture layer and the free layer. This magnetic random access memory has a simpler design than conventional devices and can be manufactured more easily, which improves the integrity of the manufacturing process.

20 Claims, 12 Drawing Sheets

(56) References Cited

U.S. PATENT DOCUMENTS

| | | | |
|---|---|---|---|
| 9,444,036 B1* | 9/2016 | Franca-Neto | H01L 43/02 |
| 9,525,126 B1* | 12/2016 | Lin | H01L 43/02 |
| 9,748,263 B2* | 8/2017 | Jang | H01L 27/11582 |
| 2003/0123199 A1* | 7/2003 | Honda | B82Y 25/00 |
| | | | 360/324 |
| 2007/0189064 A1 | 8/2007 | Min et al. | |
| 2008/0008908 A1* | 1/2008 | Ishiwata | B82Y 25/00 |
| | | | 428/811 |
| 2012/0032287 A1 | 2/2012 | Li et al. | |
| 2014/0175577 A1* | 6/2014 | Apalkov | H01L 43/08 |
| | | | 257/421 |
| 2015/0054058 A1* | 2/2015 | Seol | H01L 29/42332 |
| | | | 257/324 |
| 2016/0225821 A1* | 8/2016 | Masuoka | H01L 27/228 |
| 2017/0062519 A1* | 3/2017 | Bandic | H01L 27/222 |
| 2017/0069685 A1* | 3/2017 | Lin | H01L 43/02 |
| 2017/0148851 A1* | 5/2017 | Hsu | H01L 27/11514 |
| 2018/0286917 A1* | 10/2018 | Song | H01L 27/228 |

\* cited by examiner

MAGNETIC RANDOM ACCESS MEMORY AND MANUFACTURE THEREOF

CROSS-REFERENCE TO RELATED APPLICATION

This application claims priority to and benefit of Chinese Patent Application No. 201610925894.4 filed on Oct. 31, 2016, which is incorporated herein by reference in its entirety.

BACKGROUND

(a) Field of the Invention

This inventive concept relates to semiconductor technologies, more specifically, a magnetic random access memory and its manufacturing method.

(b) Description of the Related Art

Magnetic Random Access Memory (MRAM) uses resistance characteristic of a magnetic field to record data. In MRAM, binary data of 0 and 1 can be recorded by different resistances resulting from different magnetization directions, and the resistances will not change as long as the magnetic field is not changed.

Conventional planar MRAM typically comprises three layers: a free layer connecting a bit line, a fixture layer connecting a word line, and an insulation layer positioned between the free layer and the fixture layer. The magnetization direction in the free layer is configurable and the magnetization direction in the fixture layer is fixed. When the magnetization direction in the free layer is the same as the magnetization direction in the fixture layer, a memory unit has a low resistance and the data 0 is recorded; when the magnetization direction in the free layer is opposite to the magnetization direction in the fixture layer, the memory unit has a high resistance and the data 1 is recorded.

With the advancement of technical specification, the limitations of existing planar MRAMs are becoming more cumbersome and 3-dimensional (3D) MRAM is becoming a more attractive choice. FIG. 1 shows a schematic cross-sectional view illustrating a conventional 3D MRAM. This 3D MRAM has a similar connection structure as that of a planar MRAM. It comprises a fixture layer 101 connecting a word line 105, a free layer 103 connecting a bit line 104, and an insulation layer 102 positioned between the fixture layer 101 and the free layer 103. To manufacture this 3D MRAM, a cavity need to be formed in a dielectric layer 106, and three layers (the fixture layer 101, the insulation layer 102, and the free layer 103 as shown in a dash-line box in FIG. 1) need to be formed by Atomic Layer Deposition (ALD) within the cavity. This is a difficult manufacturing process and the layers formed in a concave area, even for those formed by ALD, are prone to manufacturing defects, which deteriorate the performance of the resulted semiconductor devices.

SUMMARY

This summary is related to some of many embodiments of the inventive concept disclosed herein and is not intended to limit the scope of this inventive concept.

A magnetic random access memory device, comprising:
a word line;
a bit line; and
a memory unit positioned between the word line and the bit line, comprising:
a fixture layer connecting the bit line;
a free layer connecting the word line; and
an insulation layer positioned between the fixture layer and the free layer.

Additionally, the aforementioned device may further comprise:
a plurality of memory units, wherein the memory units share a fixture layer.

Additionally, in the aforementioned device, the memory units may share an insulation layer.

Additionally, in the aforementioned device, the neighboring memory units may be separated by the free layers.

Additionally, in the aforementioned device, the free layers of the memory units may be arranged along an extension direction of the insulation layer.

Additionally, the aforementioned device may further comprise:
a plurality of word lines, with each word line connecting the free layer of a corresponding memory unit.

Additionally, the aforementioned device may further comprise:
dielectric layers positioned between the neighboring free layers.

Additionally, in the aforementioned device, the fixture layer may surround an outer surface of the bit line, the insulation layer may surround an outer surface of the fixture layer, and the free layer may surround an outer surface of the insulation layer.

Additionally, the aforementioned device may further comprise:
a substrate, wherein the bit lines, the word lines, and the memory units are all positioned on the substrate, and wherein the extension direction of the insulation layer is substantially perpendicular to an upper surface of the substrate.

Additionally, in the aforementioned device, the fixture layer may be a magnetic fixture layer and the free layer is a magnetic free layer.

This inventive concept further presents a method for manufacturing a magnetic random memory device, comprising:
providing a plurality of sacrificial layers and a plurality of dielectric layers alternately stacking over each other;
forming a through-hole by etching the sacrificial layers and the dielectric layers;
forming an insulation layer on a side surface of the through-hole;
forming a fixture layer on a side surface of the insulation layer;
forming a bit line on a side surface of the fixture layer, wherein the bit line filling the through-hole;
forming a plurality of cavities by removing the sacrificial layers; and
forming a plurality of free layers within the cavities and word lines connecting the free layers, wherein the neighboring free layers are separated by the dielectric layers.

Additionally, in the aforementioned method, forming a plurality of cavities by removing sacrificial layers may comprise:
forming a groove by etching the sacrificial layers and dielectric layers; and
forming a plurality of cavities by removing the sacrificial layers through the groove.

Additionally, in the aforementioned method, forming a plurality of free layers within the cavities and word lines connecting the free layers may comprise:

forming free layers on a side surface of the groove and within the cavities;

forming a word line metal layer on the free layers filling the groove and the cavities; and forming a plurality of free layers and word lines connecting the free layers by removing the word line metal layer within the groove and a portion of the free layers on a side surface of the groove, wherein the neighboring free layers are separated by the dielectric layers.

Additionally, in the aforementioned method, the fixture layer may surround an outer surface of the bit line, the insulation layer may surround an outer surface of the fixture layer, and the free layer may surround an outer surface of the insulation layer.

Additionally, in the aforementioned method, providing a plurality of sacrificial layers and a plurality of dielectric layers alternately stacking over each other may comprise:

providing a substrate; and forming a plurality of sacrificial layers and a plurality of dielectric layers alternately stacking over each other on the substrate, forming a through-hole by etching the sacrificial layers and the dielectric layers comprises forming a through-hole to expose an upper surface of the substrate.

Additionally, in the aforementioned method, the fixture layer may be a magnetic fixture layer and the free layer is a magnetic free layer.

DETAILED DESCRIPTION OF THE EMBODIMENTS

Figure 1:
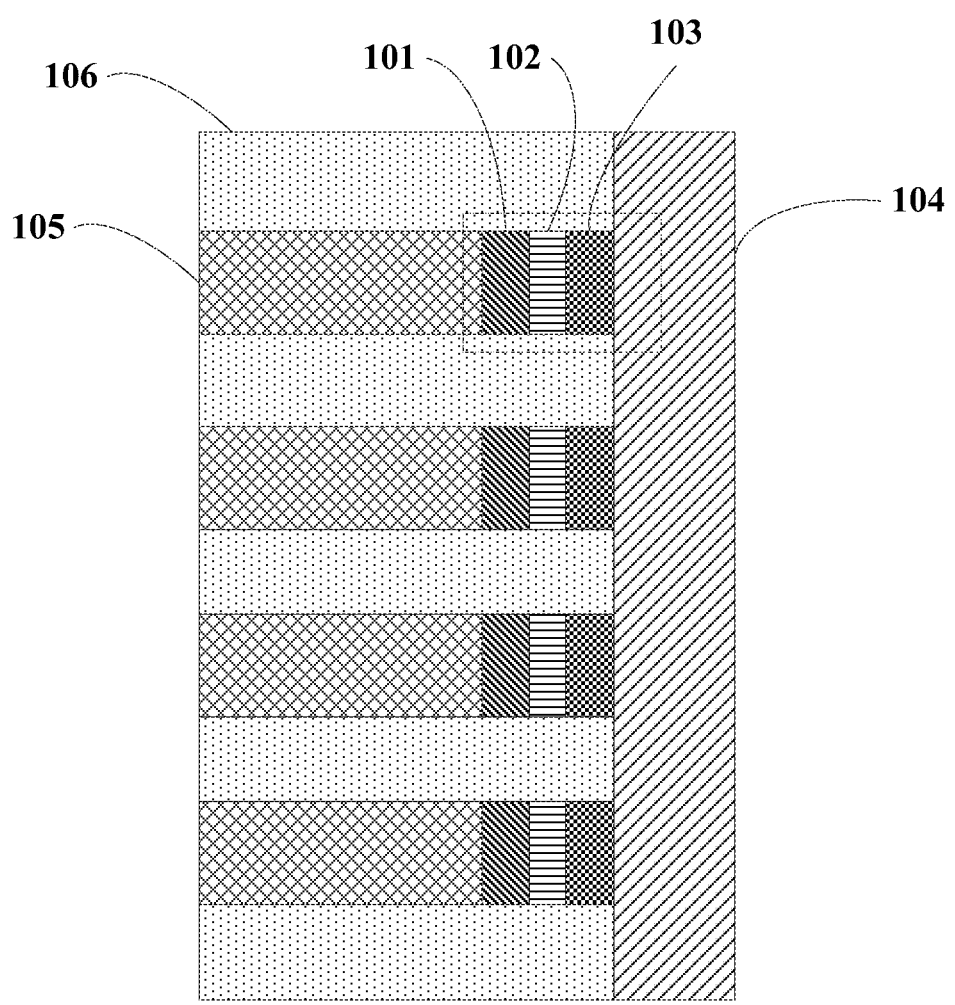
FIG. 1 shows a schematic cross-sectional view illustrating a conventional 3D magnetic random access memory.

Example embodiments of the inventive concept are described with reference to the accompanying drawings. As those skilled in the art would realize, the described embodiments may be modified in various ways without departing from the spirit or scope of the inventive concept. Embodiments may be practiced without some or all of these specified details. Well known process steps and/or structures may not be described in detail, in the interest of clarity.

The drawings and descriptions are illustrative and not restrictive. Like reference numerals may designate like (e.g., analogous or identical) elements in the specification. To the extent possible, any repetitive description will be minimized.

Relative sizes and thicknesses of elements shown in the drawings are chosen to facilitate description and understanding, without limiting the inventive concept. In the drawings, the thicknesses of some layers, films, panels, regions, etc., may be exaggerated for clarity.

Embodiments in the figures may represent idealized illustrations. Variations from the shapes illustrated may be possible, for example due to manufacturing techniques and/or tolerances. Thus, the example embodiments shall not be construed as limited to the shapes or regions illustrated herein but are to include deviations in the shapes. For example, an etched region illustrated as a rectangle may have rounded or curved features. The shapes and regions illustrated in the figures are illustrative and shall not limit the scope of the embodiments.

Although the terms "first," "second," etc. may be used herein to describe various elements, these elements shall not be limited by these terms. These terms may be used to distinguish one element from another element. Thus, a first element discussed below may be termed a second element without departing from the teachings of the present inventive concept. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

If a first element (such as a layer, film, region, or substrate) is referred to as being "on," "neighboring," "connected to," or "coupled with" a second element, then the first element can be directly on, directly neighboring, directly connected to or directly coupled with the second element, or an intervening element may also be present between the first element and the second element. If a first element is referred to as being "directly on," "directly neighboring," "directly connected to," or "directly coupled with" a second element, then no intended intervening element (except environmental elements such as air) may also be present between the first element and the second element.

Spatially relative terms, such as "beneath," "below," "lower," "above," "upper," and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientation), and the spatially relative descriptors used herein shall be interpreted accordingly.

The terminology used herein is for the purpose of describing particular embodiments and is not intended to limit the inventive concept. As used herein, singular forms, "a," "an," and "the" may indicate plural forms as well, unless the context clearly indicates otherwise. The terms "includes" and/or "including," when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as what is commonly understood by one of ordinary skill in the art related to this field. Terms, such as those defined in commonly used dictionaries, shall be interpreted as having meanings that are consistent with their meanings in the context of the relevant art and shall not be interpreted in an idealized or overly formal sense unless expressly so defined herein.

The term "connect" may mean "electrically connect." The term "insulate" may mean "electrically insulate."

Unless explicitly described to the contrary, the word "comprise" and variations such as "comprises," "comprising," "include," or "including" may imply the inclusion of stated elements but not the exclusion of other elements.

Various embodiments, including methods and techniques, are described in this disclosure. Embodiments of the inventive concept may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the inventive concept may also cover apparatuses for practicing embodiments of the inventive concept. Such apparatus may include circuits, dedicated and/or programmable, to carry out operations pertaining to embodiments of the inventive concept. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments of the inventive concept.

Figure 2:
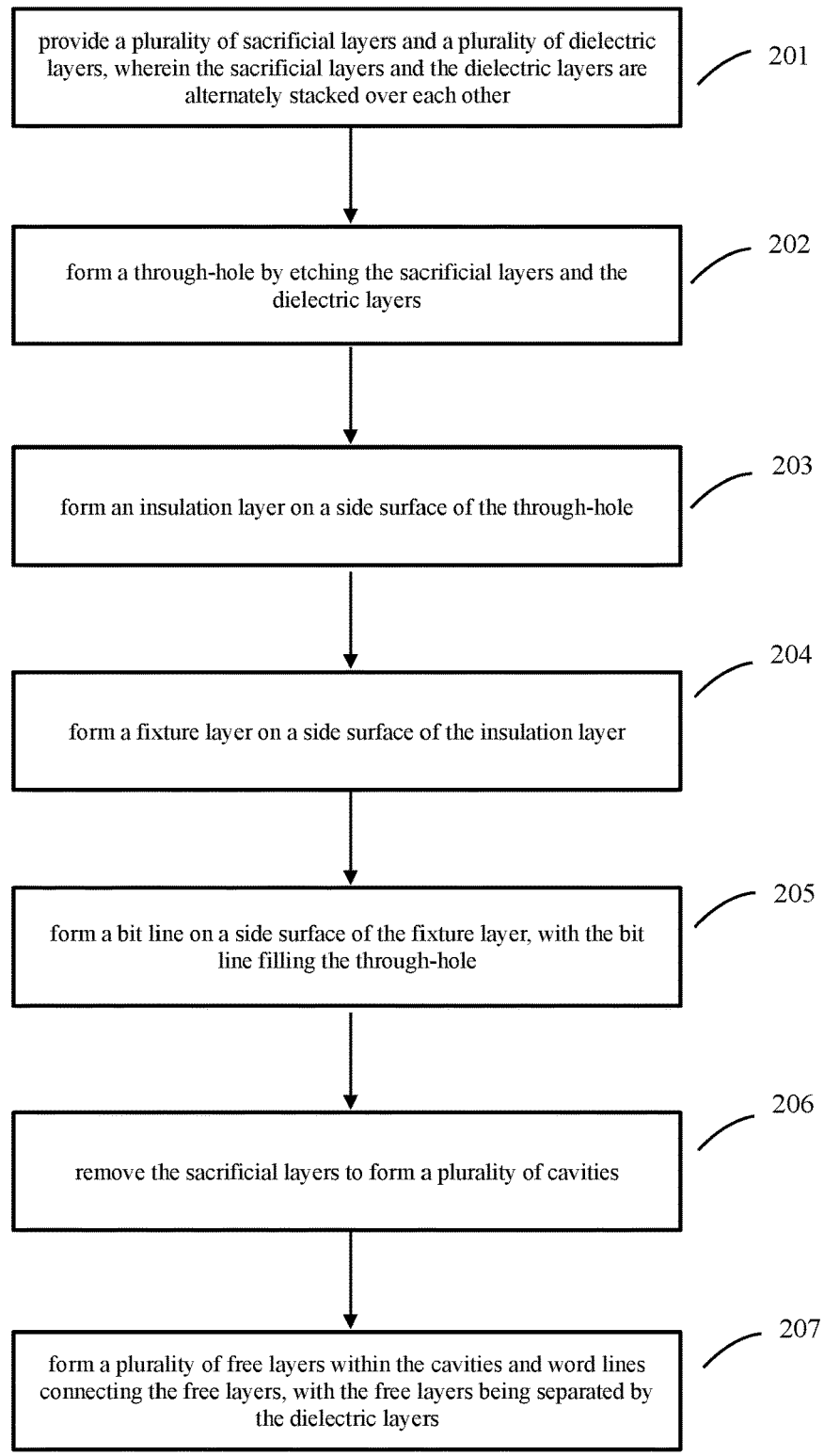
FIG. 2 shows a flowchart illustrating manufacture procedures of a magnetic random access memory in accordance with one or more embodiments of this inventive concept.

FIG. 2 shows a flowchart illustrating manufacture procedures of a magnetic random access memory in accordance with one or more embodiments of this inventive concept. FIGS. 3, 4, 5, 6, 7, 8, 9, 10, 11, and 12 show schematic cross-sectional views illustrating different stages of manufacturing a magnetic random access memory in accordance with one or more embodiments of this inventive concept. Referring to these figures, a manufacturing method of a magnetic random access memory in accordance with one or more embodiments of this inventive concept is described below.

Referring to FIG. 2, in step S201, a plurality of sacrificial layers and a plurality of dielectric layers are provided, wherein the sacrificial layers and dielectric layers are alternately stacked over each other.

Figure 3:
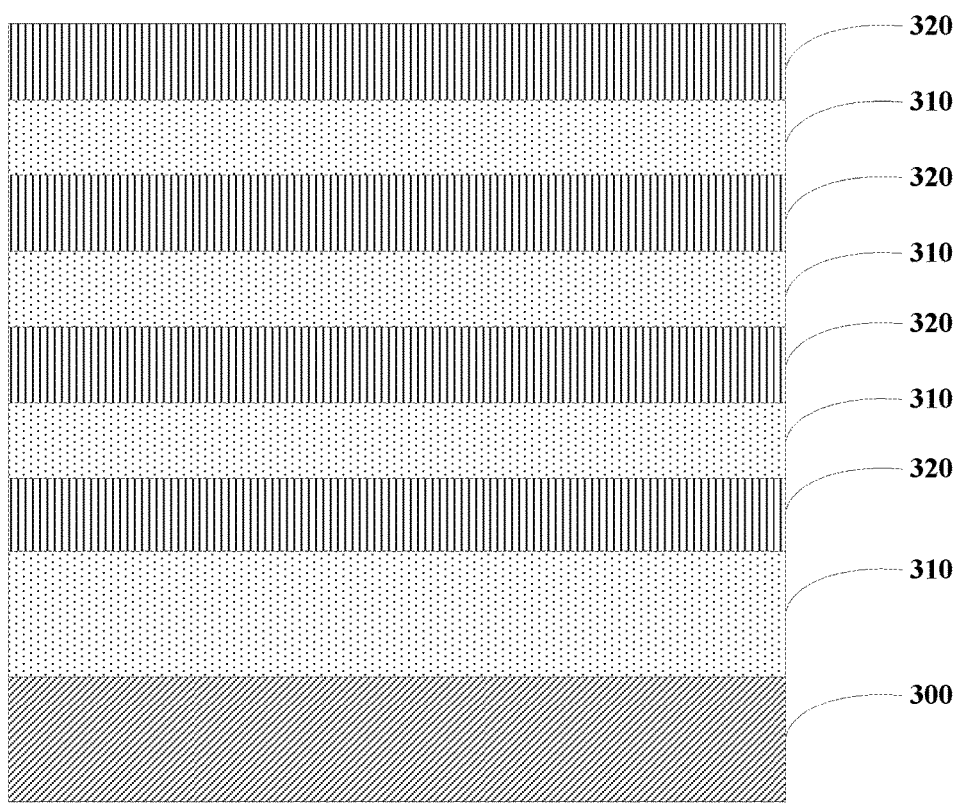
FIGS. 3, 4, 5, 6, 7, 8, 9, 10, 11, and 12 show schematic cross-sectional views illustrating different stages of manufacturing a magnetic random access memory in accordance with one or more embodiments of this inventive concept.

FIG. 3 shows a schematic cross-sectional view illustrating step S201. Referring to FIG. 3, step S201 may comprise providing a substrate 300, the substrate 300 may be a silicon substrate or other type of substrate, it may also be a semiconductor structure comprising other structures or layers and is not limited herein. Optionally, step S201 may further comprise forming a plurality of sacrificial layers 320 and a plurality of dielectric layers 310 on the substrate 300, wherein the sacrificial layers 320 and the dielectric layers 310 are stacked alternately over each other, as shown in FIG. 3. The sacrificial layers 320 and the dielectric layers 310 may be made of different materials. For example, the sacrificial layers 320 may be made of silicon nitride and the dielectric layers 310 may be made of silicon-based oxide. In step S201, a dielectric layer 310 may first be deposited on the substrate 300, then a sacrificial layer 320 is deposited on that dielectric layer 310, then another dielectric layer 310 is deposited on that sacrificial layer 320, and so on, as shown in FIG. 3.

Referring to FIG. 2, in step S202, a through-hole is formed by etching the sacrificial layers and the dielectric layers.

Figure 4:
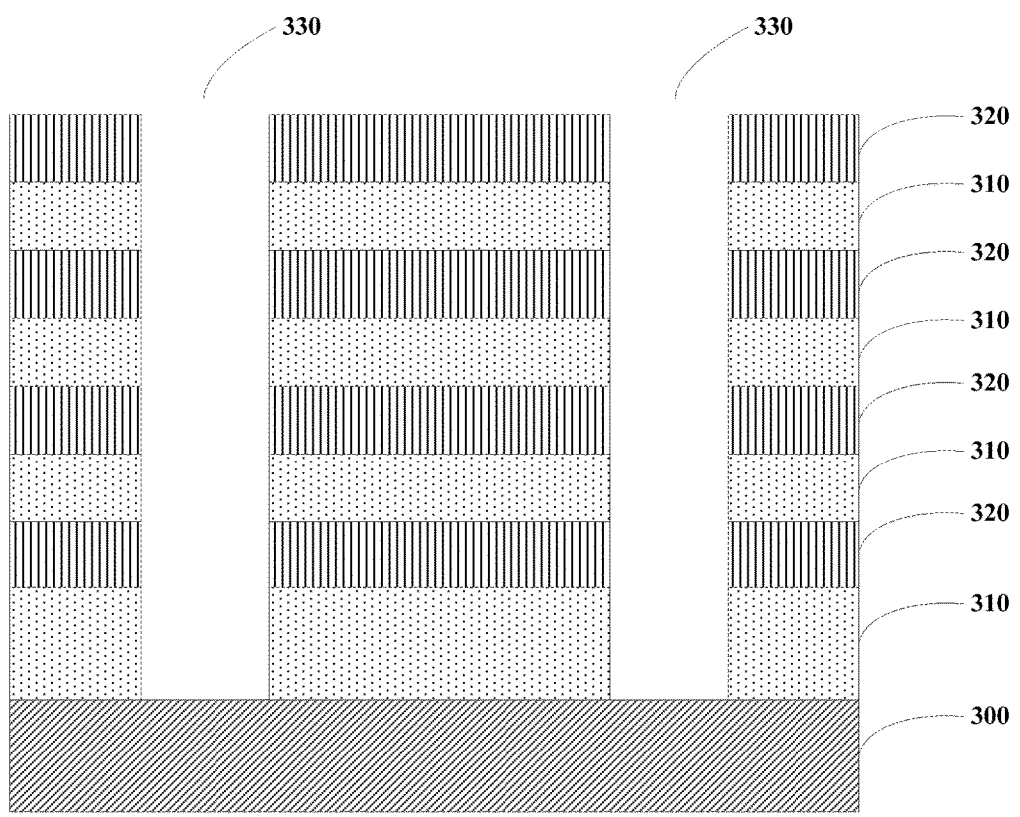

FIG. 4 shows a schematic cross-sectional view illustrating step S202. Referring to FIG. 4, a through-hole 330 may be formed by etching through the sacrificial layers 320 and the dielectric layers 310. The through-hole 330 may go through the sacrificial layers 320 and the dielectric layers 310. Optionally, as shown in FIG. 4, the through-hole 330 may expose an upper surface of the substrate 300.

Referring to FIG. 2, in step S203, an insulation layer is formed on a side surface of the through-hole.

Figure 5:
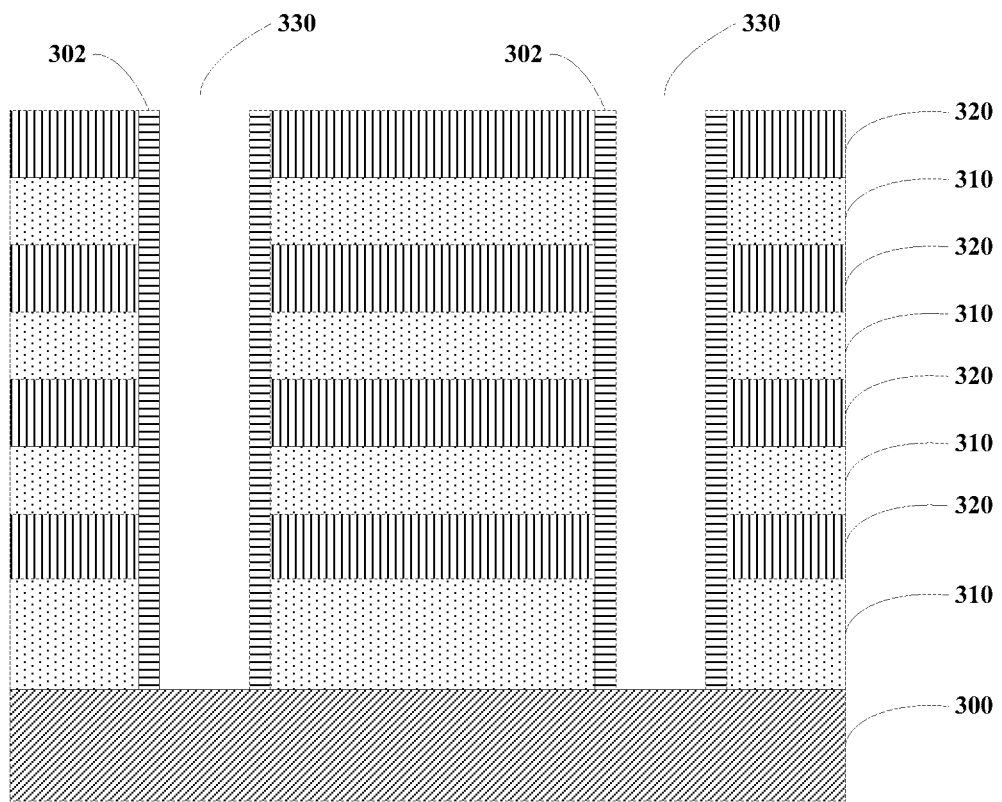

FIG. 5 shows a schematic cross-sectional view illustrating step S203. Referring to FIG. 5, an insulation layer 302 may be formed on a side surface of the through-hole 330 by Atomic Layer Deposition (ALD). Step S203 may comprise forming the insulation layer 302 on the side surface and the bottom of the through-hole 330. Optionally, step S203 may further comprise removing a portion of the insulation layer 302 on the bottom of the through-hole 330 while retaining a portion of the insulation layer 302 on the side surface of the through-hole 330.

Referring to FIG. 2, in step S204, a fixture layer is formed on a side surface of the insulation layer.

Figure 6:
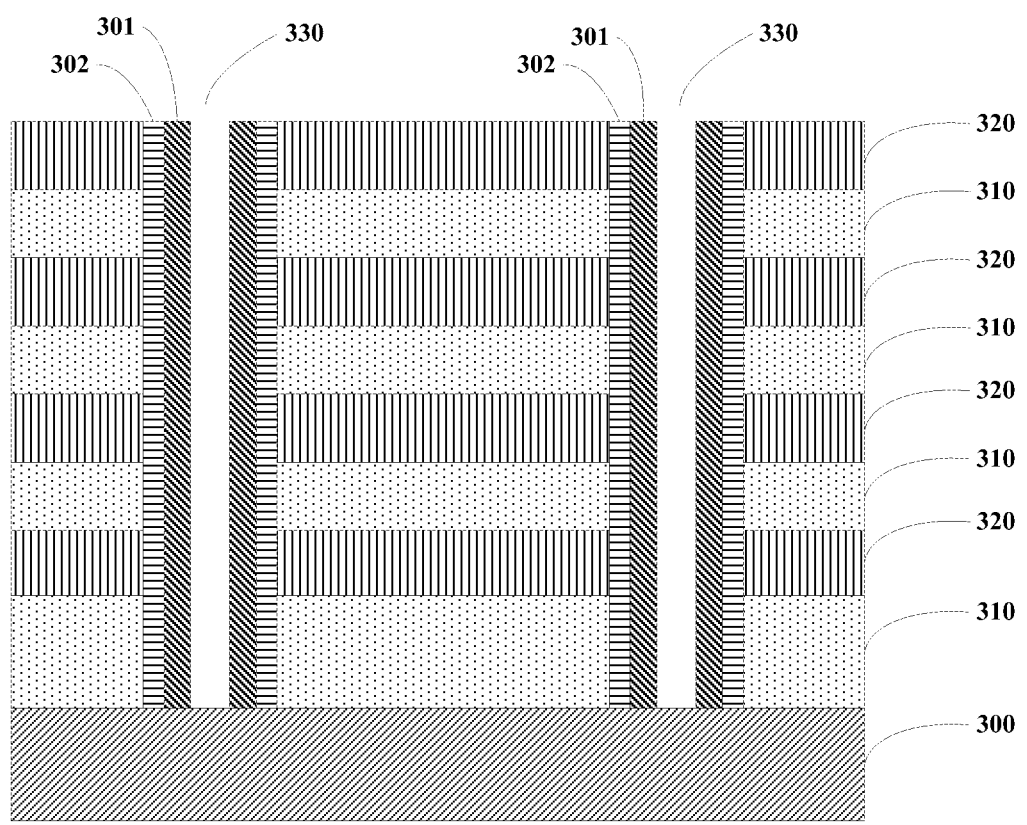

FIG. 6 shows a schematic cross-sectional view illustrating step S204. Referring to FIG. 6, a fixture layer 301 may be formed on a side surface of the insulation layer 302 by ALD. The fixture layer 301 may be a magnetic fixture layer. Optionally, step S204 may comprise forming the fixture layer 301 on the side surface of the insulation layer 302 and on the bottom of the through-hole 330. Optionally, step S204 may further comprise removing a portion of the fixture layer 301 on the bottom of the through-hole 330 by an etching process.

Referring to FIG. 2, in step S205, a bit line filling the through-hole is formed on a side surface of the fixture layer.

Figure 7:
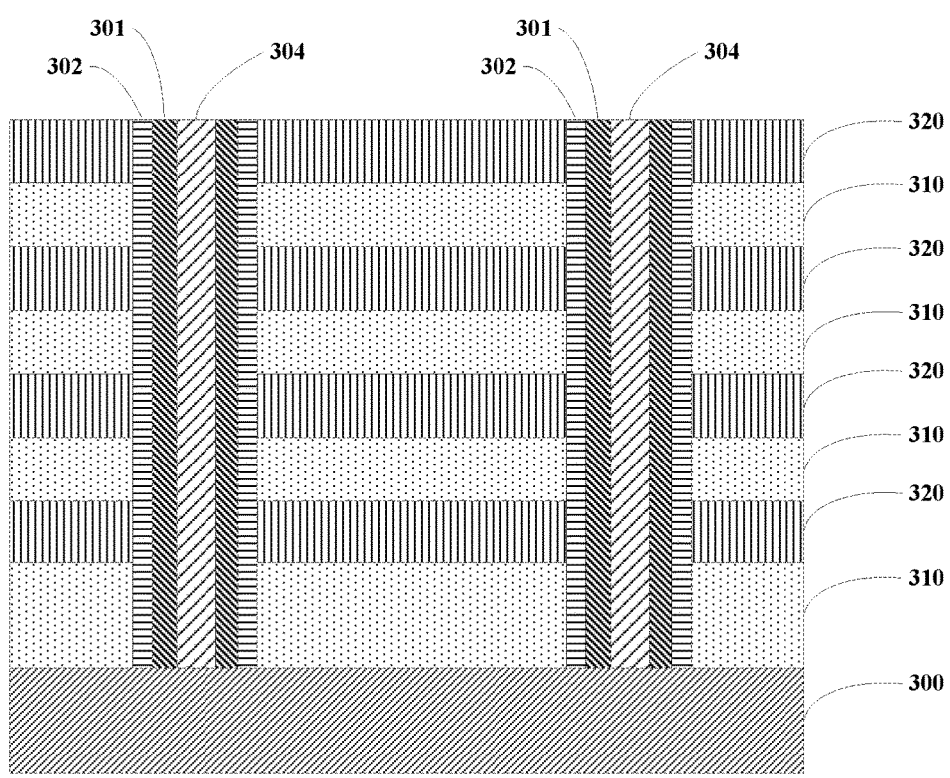

FIG. 7 shows a schematic cross-sectional view illustrating step S205. Referring to FIG. 7, a bit line 304 may be formed on a side surface of the fixture layer 301 by filling the through-hole 330. Optionally, step S205 may comprise depositing a bit line material layer on the structure shown in FIG. 6, wherein the bit line material layer fills the through-hole 330 and covers an upper surface of the top-most sacrificial layer 320. Optionally, step S205 may further comprise performing a planarization process on the bit line material layer to remove a portion of the bit line material layer on the upper surface of the top-most sacrificial layer 320, the rest of the bit line material layer fills the through-hole 330 and forms the bit line 304.

Referring to FIG. 2, in step S206, the sacrificial layers are removed to form a plurality of cavities.

Figure 8:
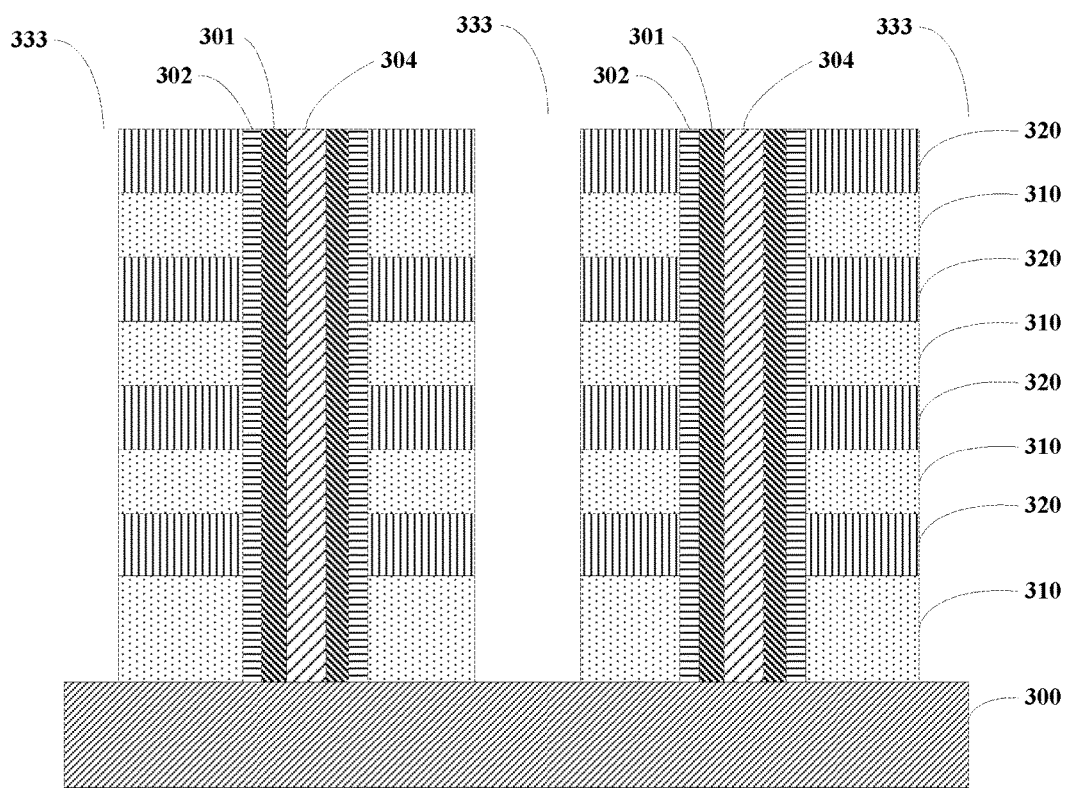
Figure 9:
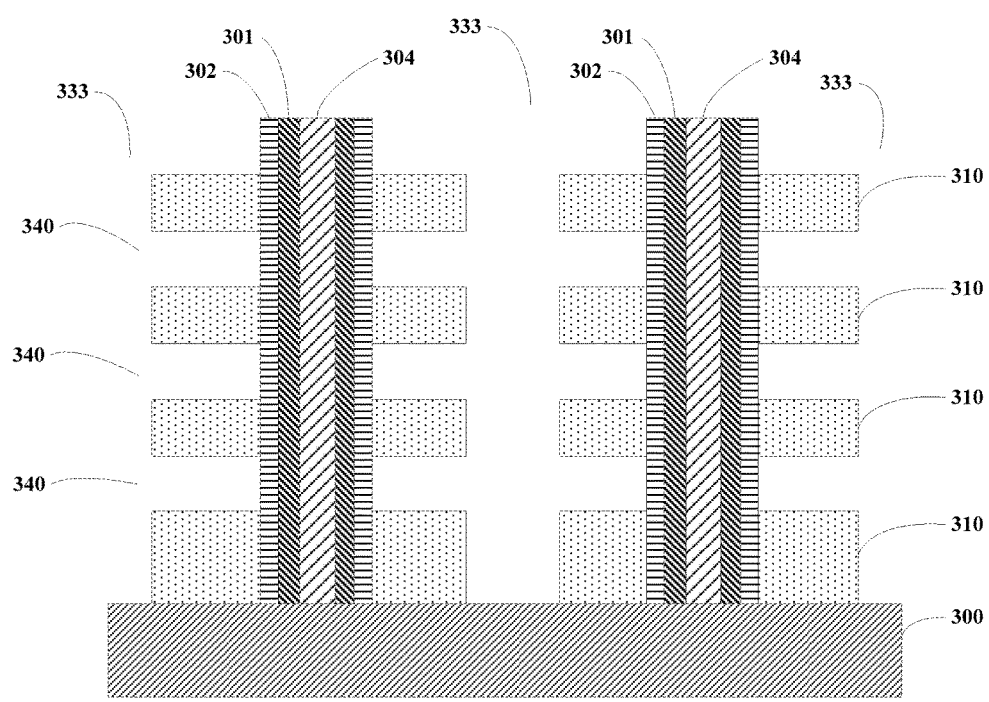

FIGS. 8 and 9 show schematic cross-sectional views illustrating different stages of step S206. Referring to FIG. 8, step S206 comprises etching through the sacrificial layers 320 and the dielectric layers 310 to form a groove 333. The groove 333 may expose the upper surface of the substrate 300. Referring to FIG. 9, step S206 may further comprise performing a wet etching process through the groove 333 to remove the sacrificial layers 320 to form a plurality of cavities 340. The cavities 340 extend in a plane that is parallel to the surface of the substrate 300 on which the dielectric layer 310 is formed, and have openings on the side wall.

Referring to FIG. 2, in step S207, a plurality of free layers are formed in the cavities and word lines connecting the free layers are formed, with the free layers being separated by the dielectric layers.

Figure 10:
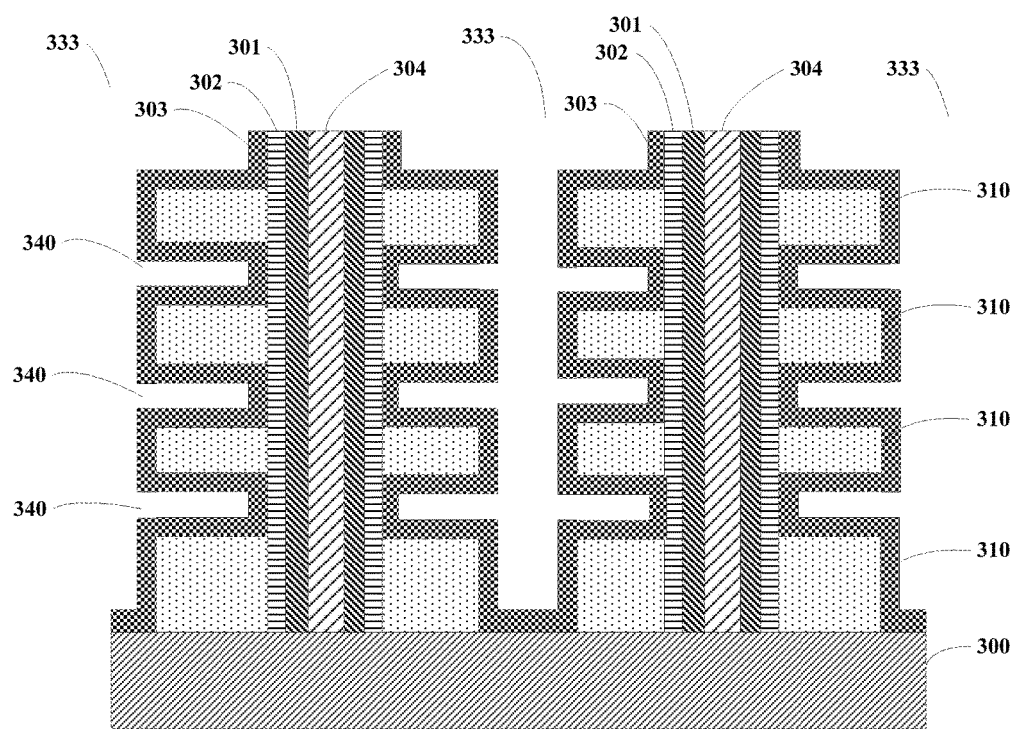
Figure 11:
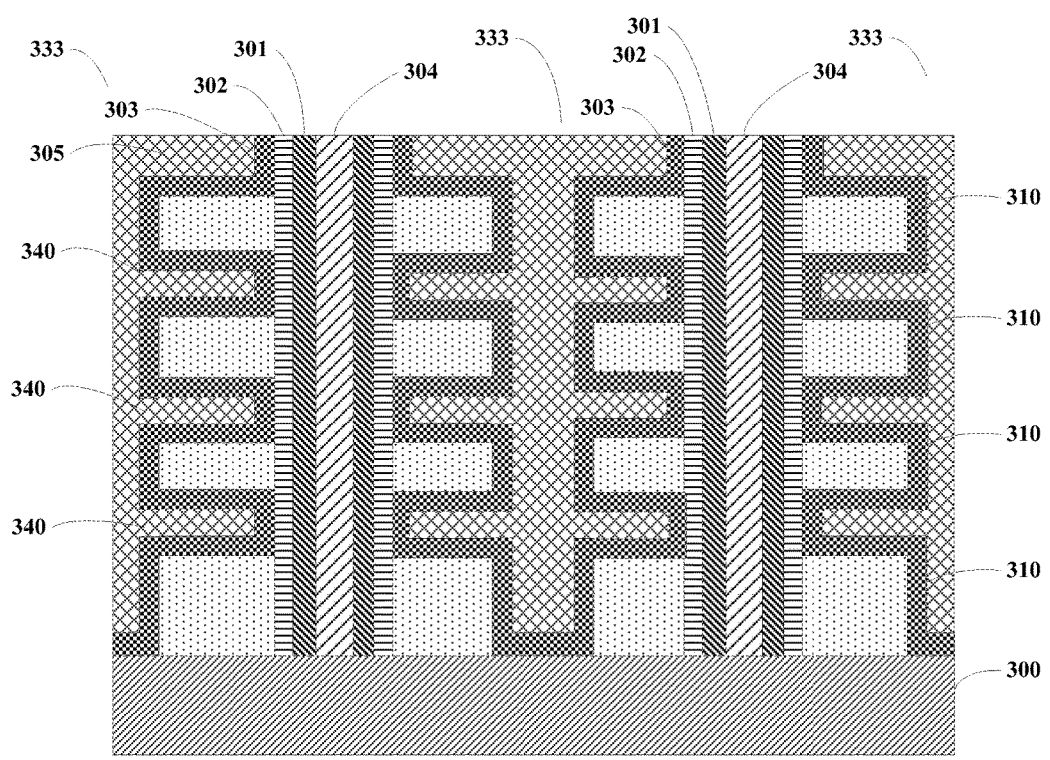
Figure 12:
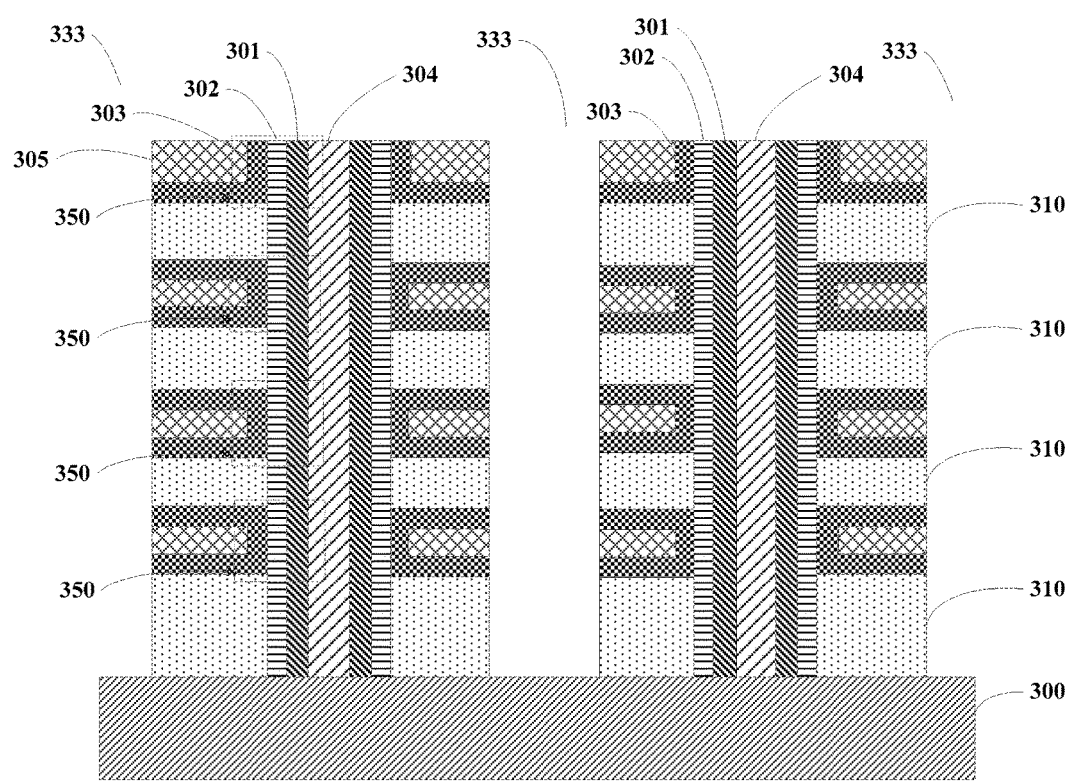

FIGS. 10, 11 and 12 show schematic cross-sectional views illustrating different stages of step S207. Referring to FIG. 10, step S207 may comprise forming a plurality of free layers 303 on a side surface of the groove 333 and within the cavities 340 by ALD. The free layers 303 may be magnetic free layers. Referring to FIG. 11, step S207 may further comprise depositing a word line metal layer 305 on the free layers 303 filling the groove 333 and the cavities 340. Referring to FIG. 12, step S207 may further comprise etching away a portion of the word line metal layer 305 within the groove 333 and a portion of the free layers 303 on the side surface of the groove 333. This process results in a plurality of free layers 303 that are separated by the dielectric layers 310 and a plurality of word lines 305 each connecting a corresponding free layer 303.

In this manufacturing process, the fixture layers 301 surrounds an outer surface of the bit line 304, the insulation layers 302 surrounds an outer surface of the fixture layer 301, and the free layers 303 surrounds an outer surface of the insulation layer 302.

This concludes a manufacturing method of a magnetic random access memory in accordance with one or more embodiments of this inventive concept. This method manufactures a magnetic random access memory, such as a 3D MRAM. In this manufacturing method, the free layers are formed within the cavities between the dielectric layers, and there is no insulation layer or fixture layer in the cavities, this simplifies the manufacturing process and the structure of the resulted magnetic random access memory. Additionally, the reduction of the layers within the cavities reduces the manufacturing defect within the cavities and improves the performance of the end product.

This application further presents a magnetic random access memory. FIG. 12 shows two magnetic random access memory in accordance to one or more embodiments of this inventive concept. Referring to FIG. 12, a magnetic random access memory in accordance with one or more embodiments of this inventive concept is described below.

Referring to FIG. 12, a magnetic random access memory comprises a word line 305, a bit line 304, and a memory unit 350 located between the word line 305 and the bit line 304, as shown in a dash-line box in FIG. 12. The memory unit 350 may comprise a fixture layer 301 connecting the bit line 304, a free layer 303 connecting the word line 305, and an insulation layer 302 positioned between the fixture layer 301 and the free layer 303. As an example, the fixture layer 301 may be a magnetic fixture layer and the free layer 303 may be a magnetic free layer.

Referring to FIG. 12, in one embodiment, the fixture layer 301 surrounds an outer surface of the bit line 304, the insulation layer 302 surrounds an outer surface of the fixture layer 301, and the free layer 303 surrounds an outer surface of the insulation layer 302. The magnetic random access memory device shown in FIG. 12 is a 3D magnetic random access memory.

Referring to FIG. 12, in one embodiment, the magnetic random access memory may comprise a plurality of memory units 350. The memory units 350 may share a common fixture layer 301, the memory units 350 may also share a common insulation layer 302. This simplifies the structure of the magnetic random access memory.

Referring to FIG. 12, in one embodiment, neighboring memory units 350 are separated by the free layers 303. The magnetic random access memory may further comprise the dielectric layers 310 located between and separating the neighboring free layers 303.

Referring to FIG. 12, in one embodiment, the magnetic random access memory may comprise a plurality of word lines 305, with each word line 305 connecting a free layer 303 of a corresponding memory unit 350. The free layers 303 of the memory units 350 are arranged along an extension direction of the insulation layer 302.

Referring to FIG. 12, in one embodiment, the magnetic random access memory may further comprise a substrate 300, wherein the word line 305, the bit line 304, and the memory unit 350 are all on the substrate 300. The extension direction of the insulation layer 302 is substantially perpendicular to an upper surface of the substrate 300.

The magnetic random access memory in accordance with this one or more embodiments of this inventive concept has a simple structure, which simplifies the manufacturing procedure and improves its integration level. Additionally, it also provides an improved performance compared to conventional magnetic random access memories.

This concludes the description of a magnetic random access memory in accordance with one or more embodiments of this inventive concept. While this inventive concept has been described in terms of several embodiments, there are alterations, permutations, and equivalents, which fall within the scope of this disclosure. It shall also be noted that there are alternative ways of implementing the methods and apparatuses of the inventive concept. Furthermore, embodiments may find utility in other applications. It is therefore intended that the claims be interpreted as including all such alterations, permutations, and equivalents. The abstract section is provided herein for convenience and, due to word count limitation, is accordingly written to guide a reader and shall not be employed to limit the scope of the claims.

What is claimed is:

1. A magnetic random access memory device, comprising:
a substrate;
a word line overlapping a face of the substrate;
a bit line overlapping the face of the substrate; and
a memory unit positioned between the word line and the bit line, comprising:
 a fixture layer connecting the bit line;
 a free layer connecting the word line, wherein the free layer exposes a face of the word line that is parallel to the face of the substrate; and
 an insulation layer positioned between the fixture layer and the free layer.

2. The device of claim 1, further comprises:
a plurality of memory units, wherein the memory units share a fixture layer.

3. The device of claim 2, wherein the memory units share an insulation layer.

4. The device of claim 2, wherein the neighboring memory units are separated by the free layers.

5. The device of claim 3, wherein the free layers of the memory units are arranged along an extension direction of the insulation layer.

6. The device of claim 4, further comprises:
a plurality of word lines, with each word line connecting the free layer of a corresponding memory unit.

7. The device of claim 6, further comprises:
dielectric layers positioned between the neighboring free layers.

8. The device of claim 1, wherein the fixture layer surrounds an outer surface of the bit line, the insulation layer surrounds an outer surface of the fixture layer, and the free layer surrounds an outer surface of the insulation layer.

9. The device of claim 5,
wherein the bit line, the word line, and the memory units are all positioned on the substrate, and wherein the extension direction of the insulation layer is substantially perpendicular to the face of the substrate.

10. The device of claim 1, wherein the fixture layer is a magnetic fixture layer and the free layer is a magnetic free layer.

11. The device of claim 1, wherein two opposite faces of the fixture layer are respectively coplanar with two opposite faces of the bit line.

12. A method for manufacturing a magnetic random access memory device, comprising:
providing a plurality of sacrificial layers and a plurality of dielectric layers alternately stacking over each other on a substrate;
forming a through-hole by etching the sacrificial layers and the dielectric layers;
forming an insulation layer on a side surface of the through-hole;
forming a fixture layer on a side surface of the insulation layer;
forming a bit line on a side surface of the fixture layer;
forming a plurality of cavities by removing the sacrificial layers, wherein the bit line is positioned between two of the cavities in a direction parallel to the substrate; and
forming a plurality of free layers within the cavities and word lines connecting the free layers, wherein the neighboring free layers are separated by the dielectric layers.

13. The method of claim 12, wherein forming a plurality of cavities by removing sacrificial layers comprises:
forming a groove by etching the sacrificial layers and the dielectric layers; and
forming a plurality of cavities by removing the sacrificial layers through the groove.

14. The method of claim 13, wherein forming a plurality of free layers within the cavities and word lines connecting the free layers comprises:
forming free layers on a side surface of the groove and within the cavities;
forming a word line metal layer on the free layers filling the groove and the cavities; and
forming a plurality of free layers and word lines connecting the free layers by removing the word line metal layer within the groove and a portion of the free layers on a side surface of the groove, wherein the neighboring free layers are separated by the dielectric layers.

15. The method of claim 12, wherein the fixture layer surrounds an outer surface of the bit line, the insulation layer surrounds an outer surface of the fixture layer, and the free layer surrounds an outer surface of the insulation layer.

16. The method of claim 12, wherein two opposite faces of the fixture layer are respectively coplanar with two opposite faces of the bit line.

17. The method of claim 12, wherein the fixture layer is a magnetic fixture layer and the free layer is a magnetic free layer.

18. The method of claim 12, wherein the through-hole exposes a surface portion of the substrate, wherein the fixture layer directly contacts the surface portion of the substrate, and wherein the bit line fills the through-hole.

19. The method of claim 12, wherein the sacrificial layers are completely removed.

20. A magnetic random access memory device, comprising:
a substrate;
a first word line overlapping the substrate;
a second word line overlapping the substrate;
a bit line overlapping the substrate;
a first memory unit positioned between the first word line and the bit line, the first memory unit comprising: a first fixture layer, a first free layer, and a first insulation layer positioned between the first fixture layer and the first free layer; and
a second memory unit positioned between the second word line and the bit line, the second memory unit comprising:
a second fixture layer connecting the bit line,
a second free layer connecting the second word line, and
a second insulation layer positioned between the second fixture layer and the second free layer,
wherein the bit line is positioned between the first memory unit and the second memory unit in a direction parallel to the substrate.

* * * * *